(12) United States Patent
Yan et al.

(10) Patent No.: US 11,662,065 B1
(45) Date of Patent: May 30, 2023

(54) MANUFACTURING METHOD OF LED FILAMENT AND MANUFACTURING METHOD OF BULB

(71) Applicant: Hangzhou Hangke Optoelectronics Co., Ltd., Hangzhou (CN)

(72) Inventors: Qianjun Yan, Hangzhou (CN); Yaoxing Wang, Hangzhou (CN); Zhaozhang Zheng, Hangzhou (CN); Lingli Ma, Hangzhou (CN)

(73) Assignee: Hangzhou Hangke Optoelectronics Co., Ltd., Hangzhou (CN)

( * ) Notice: Subject to any disclaimer, the term of this patent is extended or adjusted under 35 U.S.C. 154(b) by 0 days.

(21) Appl. No.: 17/806,001

(22) Filed: Jun. 8, 2022

(30) Foreign Application Priority Data

May 6, 2022 (CN) .......................... 202210487421.6

(51) Int. Cl.
*H01L 21/66* (2006.01)
*H01L 23/00* (2006.01)
*H01L 33/54* (2010.01)
*F21K 9/232* (2016.01)

(52) U.S. Cl.
CPC .............. *F21K 9/232* (2016.08); *H01L 22/12* (2013.01); *H01L 24/83* (2013.01); *H01L 33/54* (2013.01); *H01L 2224/83862* (2013.01); *H01L 2933/005* (2013.01)

(58) Field of Classification Search
CPC ...................................................... F21K 9/232
See application file for complete search history.

(56) References Cited

U.S. PATENT DOCUMENTS

2017/0227169 A1* 8/2017 Jiang .......................... F21V 3/02
2019/0386185 A1* 12/2019 Jiang ...................... H01L 33/501

FOREIGN PATENT DOCUMENTS

CN          207112413 U  *  3/2018  ............. F21K 9/232

* cited by examiner

*Primary Examiner* — Antonio B Crite
(74) *Attorney, Agent, or Firm* — Scbwegman Lundberg & Woessner, P.A.

(57) ABSTRACT

A manufacturing method of an LED filament and a manufacturing method of a bulb are provided. The steps are as follows: step S1, preparing a support; step S2, fixing chips; step S3, performing a first baking and performing a lighting test after cooling; step S4, dispensing a glue in which a semi-finished product is covered with a covering glue, and a viscosity of the covering glue used is 5000 to 50000 mPa·S; and step S5, performing a second baking. According to the disclosure, the preparation of the LED filament is completed through support preparing, chip fixing, the first baking, dispensing and the second baking, and the covering glue selected during dispensing has good fluidity, and the fluorescent powders mixed in the covering glue can be uniformly dispersed, thus preventing precipitation or agglomeration and ensuring good light distribution.

20 Claims, 12 Drawing Sheets

MANUFACTURING METHOD OF LED FILAMENT AND MANUFACTURING METHOD OF BULB

CROSS REFERENCE TO RELATED APPLICATIONS

This Non-provisional application claims priority under 35 U.S.C. § 119(a) to Chinese Patent Application No. 202210487421.6, filed on 6 May 2022, the entire contents of which are hereby incorporated by reference in its entirety.

TECHNICAL FIELD

The disclosure relates to a technical field of LED bulbs, in particular to a manufacturing method of an LED filament and a manufacturing method of the bulb.

BACKGROUND ART

An LED (Light Emitting Diode) is a solid semiconductor device that can convert electric energy into visible lights, which can directly convert electricity into lights. Compared with ordinary lamps (incandescent lamps, etc.), LED lamps have advantages of energy saving, long service life, good applicability, short response time, and is environmentally friendly. The LED lamps can be divided into bulb lamps, spot lamps, daytime lights, filament lamps, etc. by structure.

A filament LED lamp, referred to as a filament lamp for short, takes a shape of a traditional bulb, with a long, flat, disk or other LED lighting module (that is, an LED filament) as a light source, which not only keeps a simple and retro style of the traditional bulb, but also incorporates a current popular LED lighting scheme to replace a traditional tungsten filament bulb with high energy consumption, thus making it a new type of energy-saving and long-life light source.

A daily LED bulb is covered with fluorescent powder with a corresponding color on an LED chip, so that the LED bulb can emit white light. However, a state of the fluorescent powder affects a luminous state of the LED filament during mixing, especially it is easy for the fluorescent powder to precipitate in a covering glue, which seriously causes a light distribution of the LED filament to become worse, resulting in the LED filament not meeting requirements.

Based on the above, a manufacturing method of an LED filament, a support, an LED filament, a bulb and a manufacturing method of the bulb are provided in the disclosure, which can effectively solve above problems.

SUMMARY

An object of the disclosure is to provide a manufacturing method of an LED filament with high yield, and a manufacturing method of the bulb.

The disclosure is realized by following technical solutions.

A manufacturing method of an LED filament includes following steps:

step S1, preparing a support and selecting a support;

step S2, fixing chips in which LED chips are fixed to the support with a die-attach adhesive;

step S3, performing a first baking in which the support fixed with the LED chips is placed in a baking device for baking, and is cooled after baking;

step S4, dispensing a glue in which a semi-finished product manufactured in S3 is covered with a covering glue with a viscosity of 5000 to 50000 mPa·S; and step S5, performing a second baking in which the semi-finished product covered with the covering glue is placed into the baking device for baking, so as to obtain the LED filament after baking.

Preferably, when the chips in the LED filament are normal chips,

In the step S2, the LED chips are fixed to the support;

In the step S3, it is ensured that a temperature in the baking device reach a set temperature before the support fixed with the LED chips is placed into the baking device; and after the baking is finished, all of the LED chips are conductively connected in series or in parallel or in series and parallel through wires; and In the step S4, the viscosity of the covering glue is 5000 to 50000 mPa·S.

Preferably, when the filament is an LED filament with a flip chip,

In the step S1, pads for connecting the LED chips and a circuit for connecting respective LED chips are provided on the support;

In the step S2, the die-attach adhesive is applied to respective pads, the die-attach adhesive on adjacent pads is not connected, and both ends of each of the LED chips are respectively fixed to two adjacent pads;

In the step S3, the baking device is a tunnel furnace, and a reflow soldering process is adopted to bake the support fixed with the LED chips; and In the step S4, the viscosity of the covering glue is 5000 to 30000 mPa·S.

Preferably, the step S2 further includes:

step S21, unfreezing the die-attach adhesive stored at a low-temperature before fixing the chips;

step S22, performing die expanding of the LED chips, and adding the die-attach adhesive into a die-bonding device;

step S23, setting operation parameters of the die-bonding device;

step S24, performing a die-bonding operation with the adjusted die-bonding device in which the die-attach adhesive is firstly coated on the pad;

step S25, fixing the LED chips to the support;

step S26, inspecting and testing a first die-bonded semi-finished product; and step S27, performing a die-bonding operation in a batch if the semi-finished product is inspected and tested to be qualified; and repeating the steps S23 to S26 if the semi-finished product is inspected and tested to be unqualified, until the semi-finished product is inspected and tested to be qualified.

Preferably, the reflow soldering process adopted in the step S3 specifically includes following steps:

step S31, setting a temperature of the tunnel furnace;

step S32, heating the tunnel furnace until the temperature reaches a set value;

step S33, placing the die-bonded semi-finished product into the tunnel furnace and baking it with the reflow soldering process;

step S34, inspecting and testing the semi-finished product after the semi-finished product is baked;

step S35, baking the die-bonded semi-finished product in a batch if the semi-finished product is inspected and tested to be qualified; and repeating the steps S32 to S34 if the semi-finished product is inspected and tested to be unqualified, until the semi-finished product is inspected and tested to be qualified; and step 36: performing a lighting test on the baked semi-finished products.

Preferably, the step S4 further includes:

step S41, preparing the covering glue;

step S42, dispensing the glue on the semi-finished product qualified in the step S3 in a batch through a needle with an inner aperture of 0.45~0.75 mm; and step S43: delivering the dispensed semi-finished product into the baking device for baking.

The step S43 is executed within 30 min minutes after completion of the step S42.

Preferably, the covering glue mixed with fluorescent powders in the step S41 is proofed before use, which includes following steps:

step S411, issuing a proofing sheet according to product requirements;

step S412, formulating the proofed covering glue according to a ratio of the glue and the fluorescent powders filled in the proofing sheet;

step S413, covering the proofed covering glue on individual baked semi-finished products;

step S414, proofing and short baking the dispensed semi-finished product prepared in step S413;

step S415, inspecting and testing the proofed and short baked semi-finished product in step S414;

step S416: producing the covering glue in a batch according to the proofing sheet if the proofed and short baked semi-finished product is inspected and tested to be qualified; and repeating the steps S411 to S415 if the proofed and short baked semi-finished product is inspected and tested to be unqualified, until the proofed and short baked semi-finished product is inspected and tested to be qualified.

Preferably, the step S5 includes following steps:

step S51, long baking the baked semi-finished product after baking in step S43; and step S52: turning on the baking device to naturally cool the filament for 30 min after the long baking, and then taking out the finished LED filament.

A multi-section LED filament support includes a plurality of board bodies, and two adjacent board bodies are connected by a conductive connecting pin and an outer end of each of the board bodies at both ends is connected with a conductive pin.

An LED filament is characterized in that it is made by adopting the manufacturing method of the LED filament described above.

A multi-section LED filament includes the support. A plurality of LED chips are mounted on the support, and adjacent LED chips are electrically connected and the LED chips and the support are electrically connected through a conductive connecting wire. A covering glue layer is provided outside the support, the LED chips and the conductive connecting wire.

A bulb is characterized by comprising a lamp cap, a shell, a stem sealed with the shell, a conductive support fixed to the stem and a plurality of the LED filaments according to any of the filaments mentioned above, the filaments are electrically and conductively connected to the conductive support.

A manufacturing method of a bulb made of LED filaments with flip chips includes following steps:

shaping the stem in which a molybdenum wire is shaped by a molybdenum wire machine;

spot welding the filaments in which the filaments are passed through molybdenum wire to be fixed to the stem, and conductively connected with the conductive support;

sealing a bulb in which the stem fixed with the filaments and the shell are vacuum sealed, and a sealed cavity is filled with a gas of high thermal conductivity and low viscosity, for example: filled with helium, helium mixtures, nitrogen, nitrogen mixtures, argon, argon mixtures, neon, neon mixtures, etc.;

assembling the filaments in which a power supply is electrically connected with the filaments; and assembling with the lamp cap in which the power supply is assembled into and electrically and conductively connected with the lamp cap, and the lamp cap is fixed to the sealed shell.

A manufacturing method of a bulb made of LED filaments with normal chips includes following steps:

spot welding in which the multi-section filament is shaped, and fixed to and conductively connected with the stem;

sealing a bulb in which the stem fixed with the filaments and the shell are vacuum sealed, and a sealed cavity is filled with gas of high thermal conductivity and low viscosity;

assembling the filaments in which a power supply is electrically and conductively connected with the filaments; and assembling with the lamp cap in which the power supply is assembled into and electrically and conductively connected with the lamp cap, and the lamp cap is fixed to the sealed shell.

Compared with the prior art, the disclosure has following advantages and beneficial effects.

In the manufacturing method of the LED filament, the support, the LED filament, the bulb and the manufacturing method of the bulb according to the disclosure, the preparation of the LED filament is completed through support preparing, chip fixing, a first baking, dispensing and a second baking, and the covering glue with viscosity of 5000 to 50000 mPa·S is selected during dispensing, so that the covering glue has good fluidity, and the fluorescent powders mixed in the covering glue can be uniformly dispersed, thus preventing precipitation or agglomeration and ensuring good light distribution; with the first baking, the die-attach adhesive is cured to ensure a good bonding effect to LED chips; and with the second baking, the covering glue is cured, and the covering glue is ensured to be with good covering effect.

Figure 1:
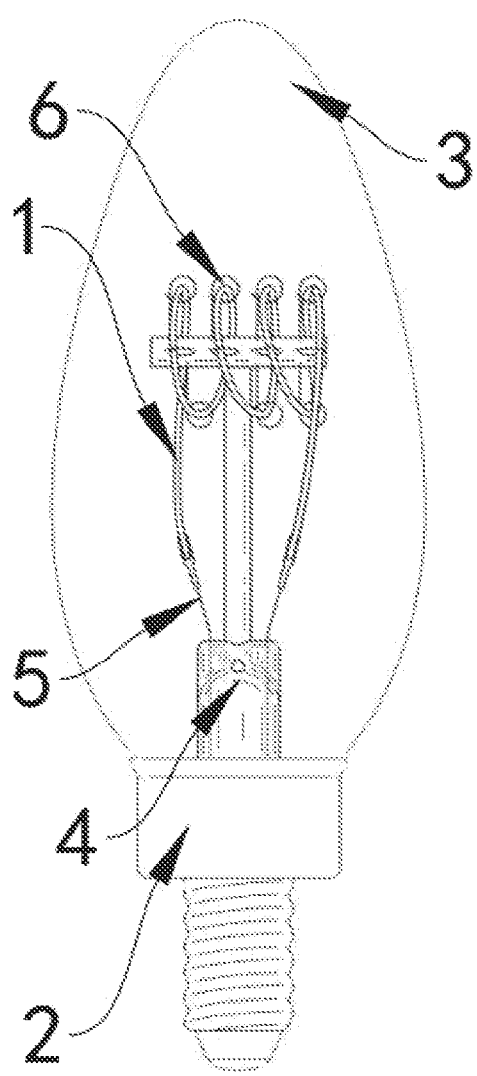
FIG. 1 is a schematic structural diagram of a bulb according to the present disclosure.
Figure 2:
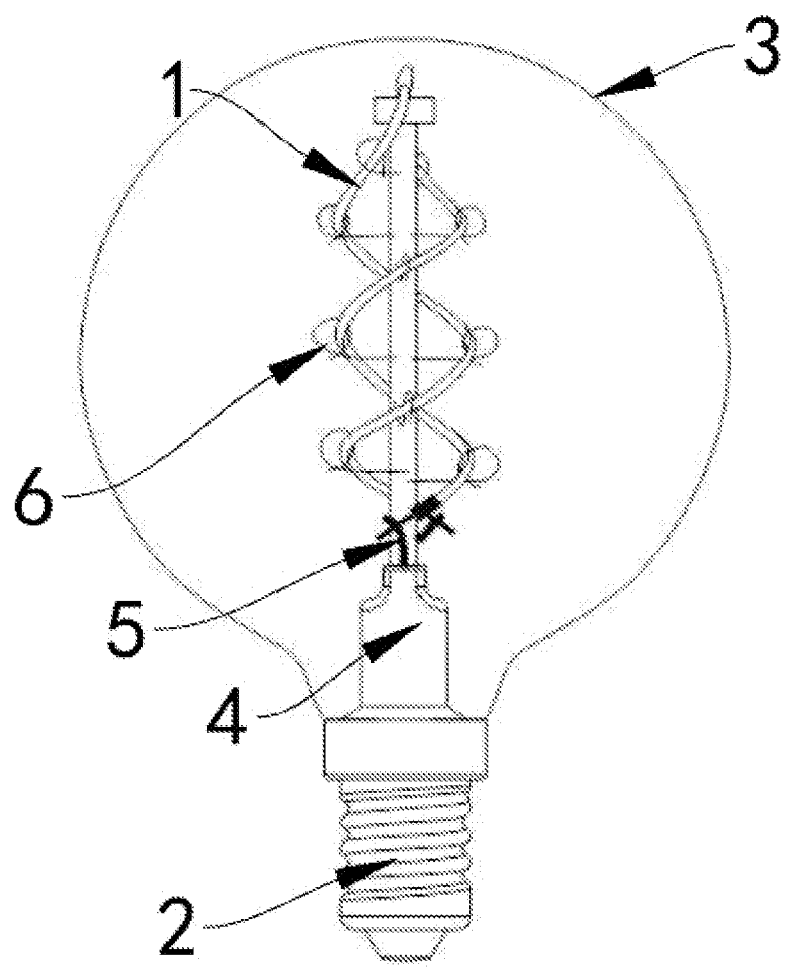
FIG. 2 is a schematic structural diagram of a bulb according to the present disclosure.
Figure 3:
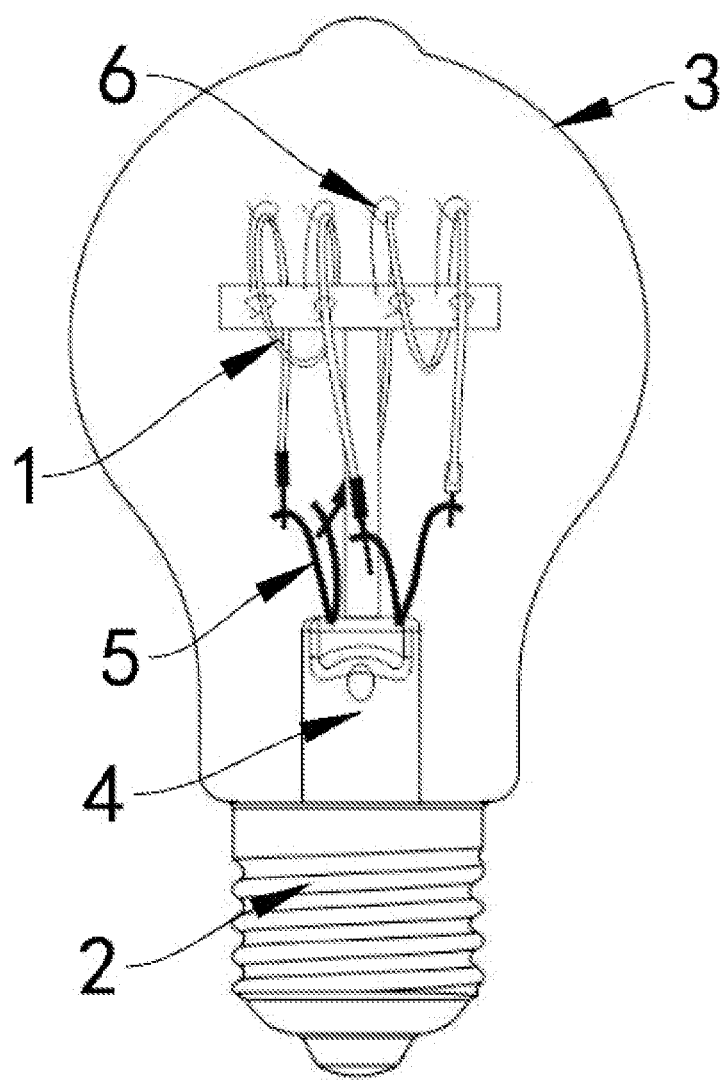
FIG. 3 is a schematic structural diagram of a bulb according to the present disclosure.
Figure 4:
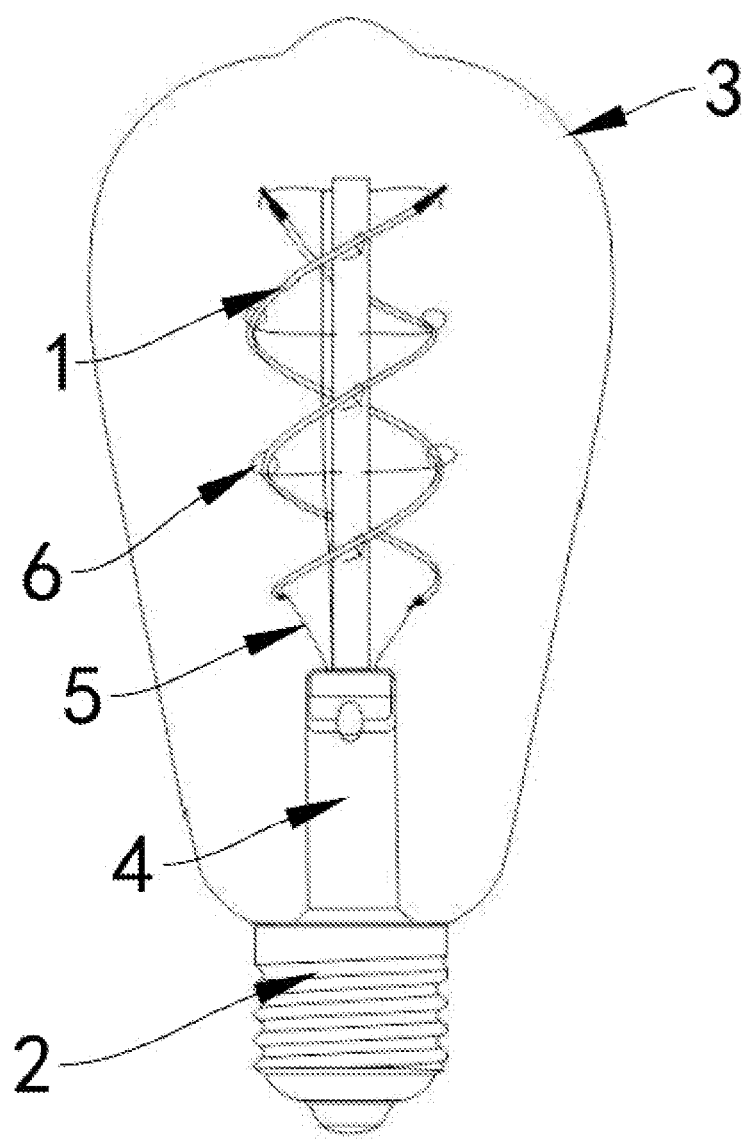
FIG. 4 is a schematic structural diagram of a bulb according to the present disclosure.
Figure 5:
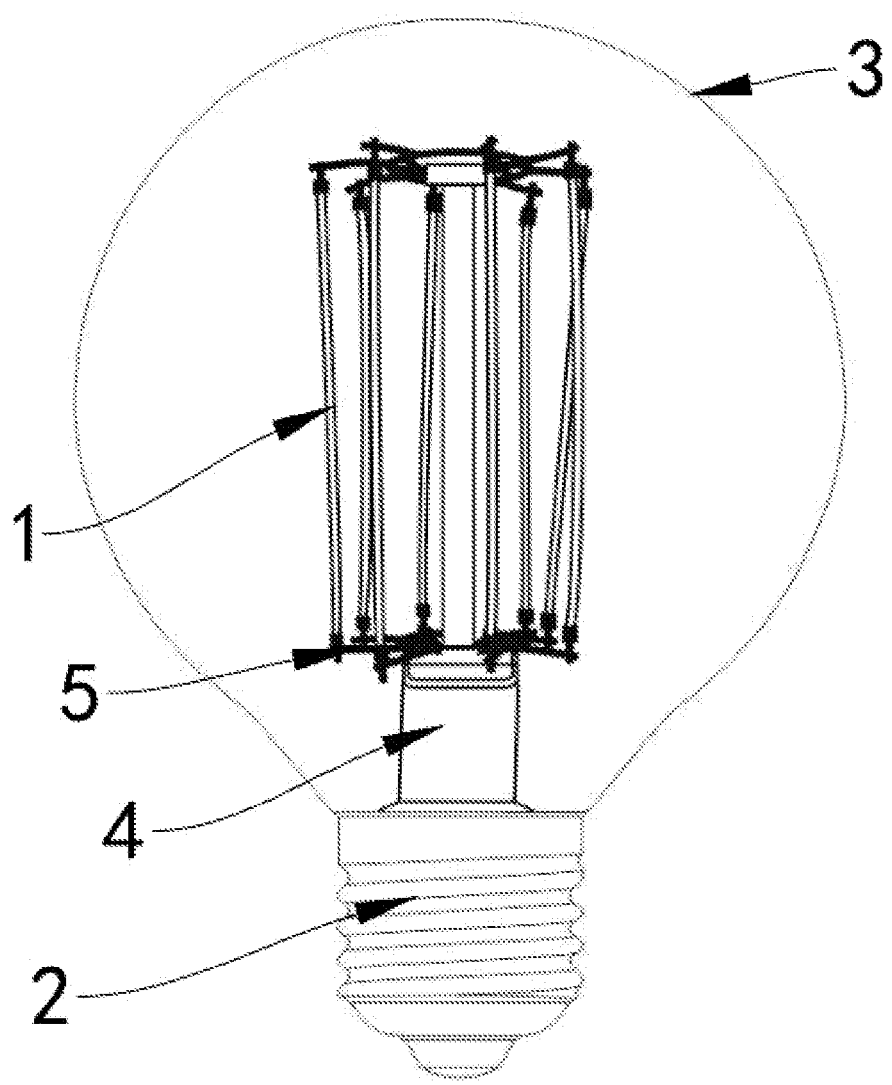
FIG. 5 is a schematic structural diagram of a bulb according to the present disclosure.
Figure 6:
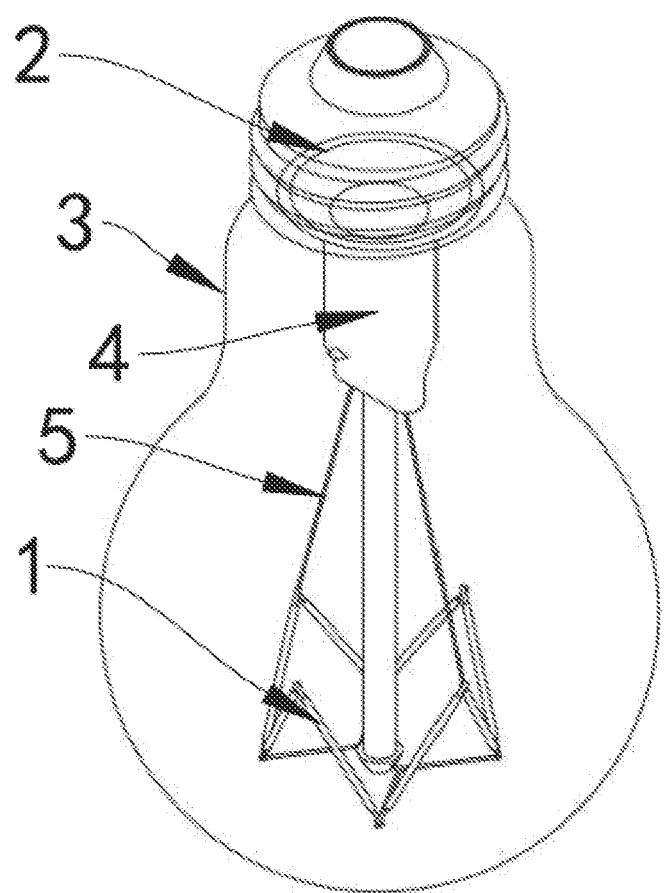
FIG. 6 is a schematic structural diagram of a bulb according to the present disclosure.
Figure 7:
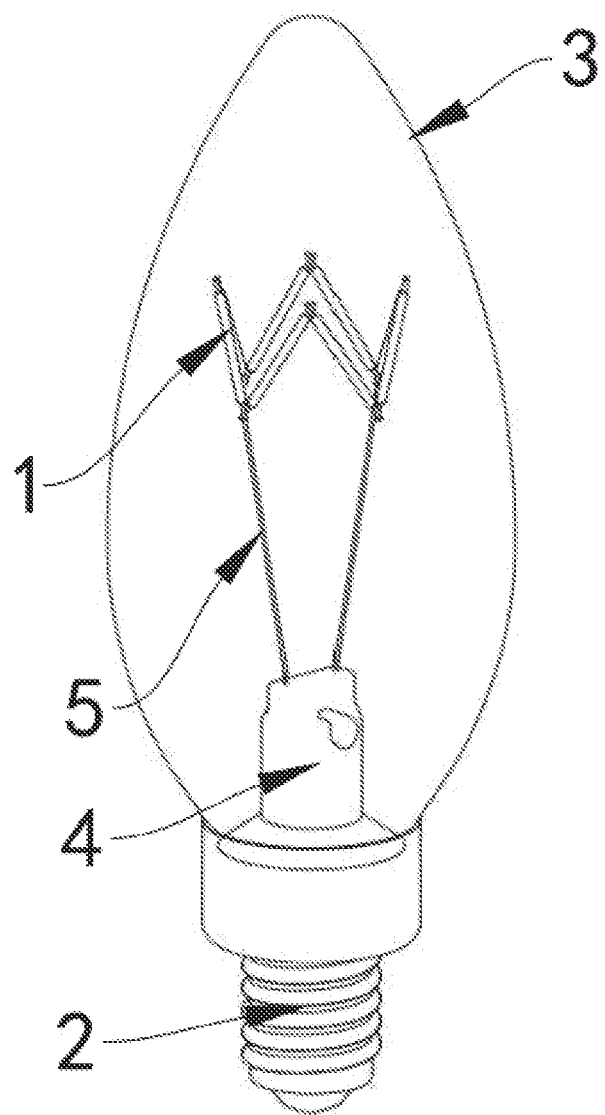
FIG. 7 is a schematic structural diagram of a bulb according to the present disclosure.
Figure 8:
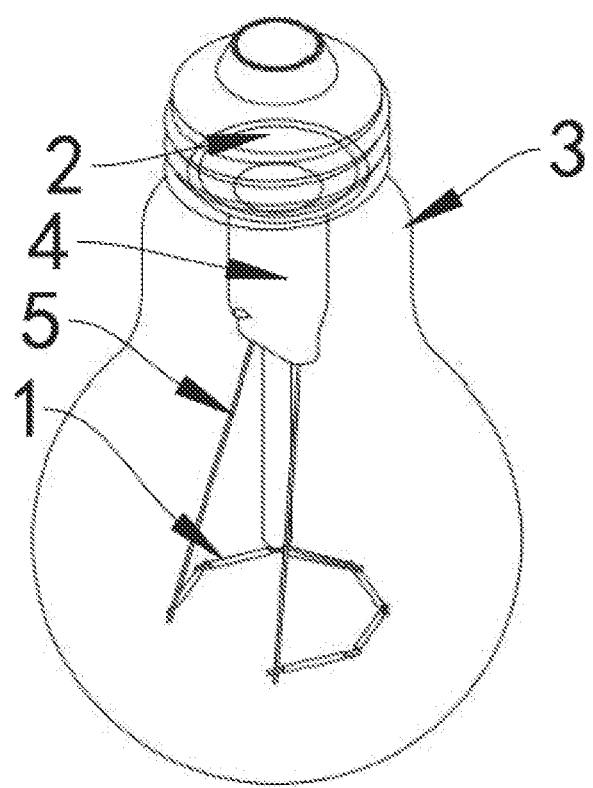
FIG. 8 is a schematic structural diagram of a bulb according to the present disclosure.

Reference Number: 1—LED Filament.

DETAILED DESCRIPTION

In order to enable those skilled in the art to better understand technical schemes of the present disclosure, preferred embodiments of the present disclosure will be described below with reference to specific embodiments, but it should be understood that the drawings are only intended for illustration and should not be construed as limiting of the disclosure. In order to better explain this embodiment, some parts of the drawings are omitted, enlarged or reduced, which do not represent a size of an actual product. For those skilled in the art, it is understandable that some well-known structures in the drawings and their descriptions may be omitted. A positional relationship described in the drawings is intended for illustration only and should not be understood as limitation of this disclosure.

Embodiment 1

A manufacturing method of an LED filament includes following steps:

step S1, preparing a support in which a plurality of supports are selected;

step S2, fixing chips in which LED chips are fixed to the support with a die-attach adhesive;

step S3, performing a first baking in which the support fixed with the LED chips is placed in a baking device for baking, and is cooled after baking;

step S4, dispensing a glue in which a semi-finished product manufactured in S3 is covered with a covering glue with a viscosity of 5000 to 50000 mPa·S; and step S5, performing a second baking in which the semi-finished product covered with the covering glue is placed into the baking device for baking, so as to obtain the LED filament after baking.

According to the disclosure, the preparation of the LED filament is completed through support preparing, chip fixing, a first baking, dispensing and a second baking, and the covering glue with viscosity of 5000 to 50000 mPa·S is selected during dispensing, so that the covering glue has good fluidity, and the fluorescent powders mixed in the covering glue can be uniformly dispersed, thus preventing precipitation or agglomeration and ensuring good light distribution; with the first baking, the die-attach adhesive is cured to ensure a good bonding effect to LED chips; and with the second baking, the covering glue is cured, and the covering glue is ensured to be with good covering effect.

A main component of the covering glue in the disclosure is silica gel, which can be mixed with fluorescent powders to adjust colors of the filament. With the silica gel as the covering glue, obvious, stable and consistent effect and high light transmittance can be provided. Therefore, the silica gel can meet requirements of high reliability and high light flux of the LED filament at the same time, and the implementation of the silica gel is simple and with low cost.

The covering glue used in the disclosure is a transparent covering glue or a covering glue mixed with fluorescent powders, and the fluorescent powders are mainly configured by one or more of nitride, fluoride, Yag and silicate.

Single-sided dispensing or double-sided dispensing can be adopted in dispensing. When the double-sided dispensing is used, proportions of fluorescent powders used in the covering glues on a front side and a back side of the filament are different or dosages of the fluorescent powders are different.

Further, in another embodiment, when the chips in the LED filament are normal chips, In the step S2, the LED chips are fixed to the support.

A welding surface of respective LED chip faces upwards, and a non-welding surface of the LED chip is fixed with the support through a die-bonding glue.

In the step S3, it is ensured that a temperature in the baking device reach a set temperature before the support fixed with the LED chips is placed into the baking device.

In the step S4, the viscosity of the covering glue is 5000 to 50000 mPa·S.

The covering glue with the viscosity of 5000 to 50000 mPa·S is selected during dispensing, so that the covering glue has good fluidity, and the fluorescent powders mixed in the covering glue can be uniformly dispersed, thus preventing precipitation or agglomeration and ensuring good light distribution. For a LED filament with a single support, the viscosity of the covering glue is 5000 to 30000 mPa·S.

In this embodiment, the die-attach adhesive only serves to fix the LED chips to the support.

In this embodiment, the baking device used for the first baking is an oven or a tunnel furnace.

According to actual requirements, the LED chip is fixed to the support at a preset position for fixing the LED chip.

Further, in another embodiment, the step S2 further includes:

step S21, unfreezing the die-attach adhesive stored at a low-temperature before fixing the chips, e.g. stored in a low-temperature device like a refrigerator.

step S22, performing die expanding of the LED chips, and adding the die-attach adhesive into a die-bonding device;

step S23, setting operation parameters of the die-bonding device;

step S24, performing a die-bonding operation with the adjusted die-bonding device in which the die-attach adhesive is firstly coated on the pad;

step S25, fixing the LED chips to the support;

step S26, inspecting and testing a first die-bonded semi-finished product; and step S27, performing a die-bonding operation in a batch if the semi-finished product is inspected and tested to be qualified; and repeating the steps S23 to S26 if the semi-finished product is inspected and tested to be unqualified, until the semi-finished product is inspected and tested to be qualified.

The first die-bonded semi-finished product is inspected and tested, mainly to check die-bonding quality and dosage of the die-attach adhesive, and to ensure that there is no abnormality in an arrangement of the LED chips used for die-bonding, and that each of the LED chips can be well fixed to the support.

Further, in another embodiment, the step S4 further includes following steps S41 to S43.

In the step S41, the covering glue is prepared.

In this step, fluorescent powders are mixed into the covering glue.

In the step S42, the glue is dispensed on the semi-finished product qualified in the step S3 in a batch through a needle with an inner aperture of 0.45~0.75 mm.

The needle with the inner aperture of 0.45~0.75 mm is used to dispense the glue, so as to ensure that the covering glue perfectly covers a substrate and the LED chips and the filament is with a small size after the covering glue is dispensed.

The needle with this aperture is selected for dispensing, not only to make the LED filament thinner, but also to ensure a good dispensing effect. When the needle with this aperture is selected and the covering glue with viscosity of 5000~50000 mPa·S is used, it will not occur that the covering glue can't be dispersed out due to too high viscosity, or the covering glue cannot cover a filament surface well because the covering glue is directly sprayed from the needle in dispensing due to too low viscosity.

In the step S43: the dispensed semi-finished product is delivered into the baking device for baking.

The step S43 is executed within 30 min minutes after completion of the step S42.

Further, the baking in the step S43 is short baking. Firstly, the dispensed semi-finished product is short baked, so that the covering glue is preliminarily cured, and the covering glue can be in a good posture during curing, and the LED filament can be dispensed uniformly.

In short baking, a temperature of the baking device is set to be 80° C. and a duration is set to be 20 minutes, so that internal fluidity of the covering glue is greatly weakened and the covering glue is quickly shaped to ensure a uniform distribution of fluorescent powders in the covering glue.

In order to avoid precipitation of the fluorescent powders in the covering glue, the dispensed semi-finished products should be delivered to the baking device within 30 min, so as to ensure the uniform distribution of the fluorescent powders and better light distribution of the LED filament.

In this embodiment, the baking device used for the short baking is an oven or a tunnel furnace.

Further, in another embodiment, the covering glue mixed with fluorescent powders in the step S41 is proofed before use, which includes following steps:

step S411, issuing a proofing sheet according to product requirements;

step S412, formulating the proofed covering glue according to a ratio of the glue and the fluorescent powders filled in the proofing sheet;

step S413, covering the proofed covering glue on the baked semi-finished product;

step S414, proofing and short baking the dispensed semi-finished product prepared in step S413;

step S415, inspecting and testing the proofed and short baked semi-finished product in step S414;

step S416: producing the covering glue in a batch according to the proofing sheet if the proofed and short baked semi-finished product is inspected and tested to be qualified; and repeating the steps S411 to S415 if the proofed and short baked semi-finished product is inspected and tested to be unqualified, until the proofed and short baked semi-finished product is inspected and tested to be qualified.

The covering glue is proofed and the semi-finished product is tested for parameters to ensure that the LED filament has good light distribution.

Further, in another embodiment, the step S5 further includes:

step S51, long baking the baked semi-finished product after baking in step S43; and step S52: turning on the baking device to naturally cool the filament for 30 min after the long baking, and then taking out the finished LED filament.

In the long baking, it is preferable to set a temperature of the baking device to be 170° C. and a duration is set to be 5 hours, so that the covering glue is completely cured and better attached to the surface of the filament.

In this embodiment, the baking device used for the long baking is an oven or a tunnel furnace.

This embodiment is used to prepare an ultra-thin ceramic LED filament. The LED chips are fixed to the support in a formal way, and the support is made of ceramic, which cannot be bent or wound.

Embodiment 2

A manufacturing method of an LED filament includes following steps:

step S1, preparing a support in which a plurality of supports are selected;

step S2, fixing chips in which LED chips are fixed to the support with a die-attach adhesive;

step S3, performing a first baking in which the support fixed with the LED chips is placed in a baking device for baking, and is cooled after baking;

step S4, dispensing a glue in which a semi-finished product manufactured in S3 is covered with a covering glue with a viscosity of 5000 to 50000 mPa·S; and step S5, performing a second baking in which the semi-finished product covered with the covering glue is placed into the baking device for baking, so as to obtain the LED filament after baking.

According to the disclosure, the preparation of the LED filament is completed through support preparing, chip fixing, a first baking, dispensing and a second baking, and the covering glue with viscosity of 5000 to 50000 mPa·S is selected during dispensing, so that the covering glue has good fluidity, and the fluorescent powders mixed in the covering glue can be uniformly dispersed, thus preventing precipitation or agglomeration and ensuring good light distribution; with the first baking, the die-attach adhesive is cured to ensure a good bonding effect to LED chips; and with the second baking, the covering glue is cured, and the covering glue is ensured to be with good covering effect.

A preferred main component of the covering glue in the disclosure is silica gel, which is mixed with fluorescent powders to adjust colors of the filament. With the silica gel as the covering glue, obvious, stable and consistent effect and high light transmittance can be provided. Therefore, the silica gel can meet requirements of high reliability and high light flux of the LED filament at the same time, and the implementation of the silica gel is simple and with low cost.

The covering glue used in the disclosure is a transparent covering glue or a covering glue mixed with fluorescent powders, and the fluorescent powders are mainly configured by one or more of nitride, fluoride, Yag and silicate.

Single-sided dispensing or double-sided dispensing can be adopted in dispensing. Preferably, when the double-sided dispensing is used, proportions of fluorescent powders used in the covering glues on a front side and a back side of the filament are different or dosages of the fluorescent powders are different.

Further, in another embodiment, when the chips in the LED filament are flip chips, In the step S1, pads for connecting the LED chips and a circuit for connecting respective LED chips are provided on a support;

In this embodiment, both ends of the support are respectively provided with a positive support and a negative support communicated with the circuit.

In the step S2, the die-attach adhesive is applied to respective pads, the die-attach adhesive on adjacent pads is not connected, and positive and negative ends of each of the LED chips are respectively fixed to two adjacent pads.

In the step S3, the baking device is a tunnel furnace, and a reflow soldering process is adopted to bake the support fixed with the LED chips; and In the step S4, the viscosity of the covering glue is 5000 to 30000 mPa·S.

The covering glue with the viscosity of 5000 to 30000 mPa·S is selected during dispensing, so that the covering glue has good fluidity, and the fluorescent powders mixed in the covering glue can be uniformly dispersed, thus preventing precipitation or agglomeration and ensuring good light distribution.

The tunnel furnace in this embodiment can be an air tunnel furnace or a nitrogen tunnel furnace.

In this embodiment, the baking device can also be an oven, but the tunnel furnace is preferred.

In this embodiment, the die-attach adhesive is a die-bonding solder paste, which has good adhesive property and good conductivity, can fix the LED chips to the support, and play a conductive role to electrically connect the LED chips with the pads at the same time, and all of the LED chips are connected through circuits.

Further, in another embodiment, the step S2 further includes:

step S21, taking the die-attach adhesive out of a refrigerator in advance before the die-bonding operation, placing it at room temperature for at least 30 minutes, and using it when there is no water droplet on a surface;

step S22, performing die expanding of the LED chips, and adding the die-attach adhesive into a die-bonding device;

step S23, setting operation parameters of the die-bonding device;

step S24, performing a die-bonding operation with the adjusted die-bonding device in which the die-attach adhesive is firstly coated on the pad;

step S25, fixing the LED chips to the support;

step S26, inspecting and testing a first die-bonded semi-finished product; and step S27, performing a die-bonding operation in a batch if the semi-finished product is inspected and tested to be qualified; and repeating the steps S23 to S26 if the semi-finished product is inspected and tested to be unqualified, until the semi-finished product is inspected and tested to be qualified.

The first semi-finished die-bonding product is inspected and tested, mainly to check whether a die-bonded chip arrangement is wrong, die-bonding quality and dosage of the die-attach adhesive, and to ensure that the die-attach adhesive covered on each of the pads is independent of each other, so as to avoid shorted-circuit of the LED chips or wrong conduction among multiple LED chips due to formation of a path between the die-attach adhesive.

Further, in another embodiment, the reflow soldering process adopted in the step S3 specifically includes following steps:

step S31, setting a temperature of the tunnel furnace;

step S32, heating the tunnel furnace until the temperature reaches a set value;

step S33, placing the die-bonded semi-finished product into the tunnel furnace and baking it with the reflow soldering process;

step S34, inspecting and testing the semi-finished product after the semi-finished product is baked;

step S35, baking the die-bonded semi-finished product in a batch if the semi-finished product is inspected and tested to be qualified; and repeating the steps S32 to S34 if the semi-finished product is inspected and tested to be unqualified, until the semi-finished product is inspected and tested to be qualified; and step 36: performing a lighting test on the baked semi-finished products.

The semi-finished product with fixed chips is baked with the reflow, and a wind force of the reflow is relatively large, which can speed up circulation of hot air and reduce baking time with ensured baking effect. Moreover, the die-attach adhesive in this embodiment is a die-bonding solder paste, and it is preferred that the reflow is adopted for the die-bonding solder paste to achieve welding effect. In a reflow device, a furnace temperature rises firstly and then decreases, which ensures that there is a buffering process for the semi-finished product during baking and after baking, avoids quality problems of the semi-finished product caused by sudden cooling and heating, and improves product quality.

Further, in another embodiment, the step S4 further includes following steps S41 to S43.

In the step S41, the covering glue is prepared.

In this step, the covering glue is formulated to required viscosity, and fluorescent powders are mixed into the covering glue.

In the step S42, the glue is dispensed on the semi-finished product qualified in the step S3 in a batch through a needle with an inner aperture of 0.45~0.75 mm.

The needle with the inner aperture of 0.45~0.75 mm is used to dispense the glue, so as to ensure that the filament covered with the glue is thinner and the LED chips can be wrapped to avoid leakage; and in this embodiment, a needle with an aperture of 0.45~0.65 mm is preferred.

The needle with this aperture is selected for dispensing, not only to make the LED filament thinner, but also to ensure a good dispensing effect. When the needle with this aperture is selected and the covering glue with viscosity of 5,000~30000 mPa·S is used, it will not occur that the covering glue can't be dispersed out due to too high viscosity, or the covering glue cannot cover a filament surface well because the covering glue is directly sprayed from the needle in dispensing due to too low viscosity.

In the step S43: the dispensed semi-finished product is delivered into the baking device for baking.

The step S43 is executed within 30 min minutes after completion of the step S42.

The baking in the step S43 is short baking. Firstly, the dispensed semi-finished product is short baked, so that the covering glue is preliminarily cured, and the covering glue can be in a good posture during curing, and the LED filament can be dispensed uniformly.

Preferably, in short baking, a temperature of the baking device is set to be 80° C. and a duration is set to be 20 minutes, so that internal fluidity of the covering glue is greatly weakened and the covering glue is quickly shaped to ensure an uniform distribution of fluorescent powders in the covering glue.

In this embodiment, the baking device used for the short baking is an oven or a tunnel furnace.

In order to avoid precipitation of the fluorescent powders in the covering glue, the dispensed semi-finished products should be delivered to the baking device within 30 min, so as to ensure the uniform distribution of the fluorescent powders and better light distribution of the LED filament.

Further, in another embodiment, the covering glue mixed with fluorescent powders in the step S41 is proofed before use, which includes following steps:

step S411, issuing a proofing sheet according to product requirements;

step S412, formulating the proofed covering glue according to a ratio of the glue and the fluorescent powders filled in the proofing sheet;

step S413, covering the proofed covering glue on individual baked semi-finished products;

step S414, proofing and short baking the dispensed semi-finished product prepared in step S413;

step S415, inspecting and testing the proofed and short baked semi-finished product in step S414;

step S416: producing the covering glue in a batch according to the proofing sheet if the proofed and short baked semi-finished product is inspected and tested to be qualified; and repeating the steps S411 to S415 if the proofed and short baked semi-finished product is inspected and tested to be unqualified, until the proofed and short baked semi-finished product is inspected and tested to be qualified.

The covering glue is proofed and the semi-finished product is tested to ensure that the LED filament has good light distribution.

Further, in another embodiment, the step S5 further includes:

step S51, long baking the baked semi-finished product after baking in step S43; and step S52: turning on the baking device to naturally cool the filament for 30 min after the long baking, and then taking out the finished LED filament.

In the long baking, it is preferable to set a temperature of the baking device to be 170° C. and a duration is set to be 5 hours, so that the covering glue is completely cured and better attached to the surface of the filament.

In this embodiment, the baking device used for the long baking is an oven or a tunnel furnace.

This embodiment is used to prepare an ultra-thin flexible LED filament. The LED chips are fixed to the support in a formal way without wire bonding, and the support is preferably a FPC, which can be freely bent and wound into any shape.

Embodiment 3

Figure 12:
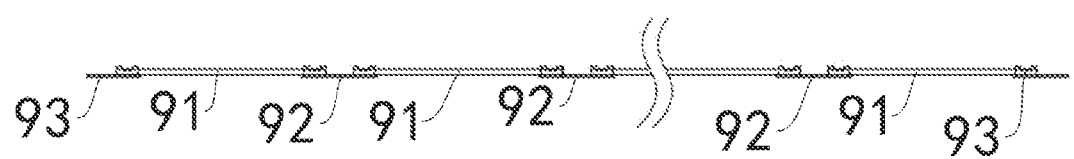
FIG. 12 is a schematic structural diagram of a support according to Embodiment 3 of the present disclosure.
Figure 13:
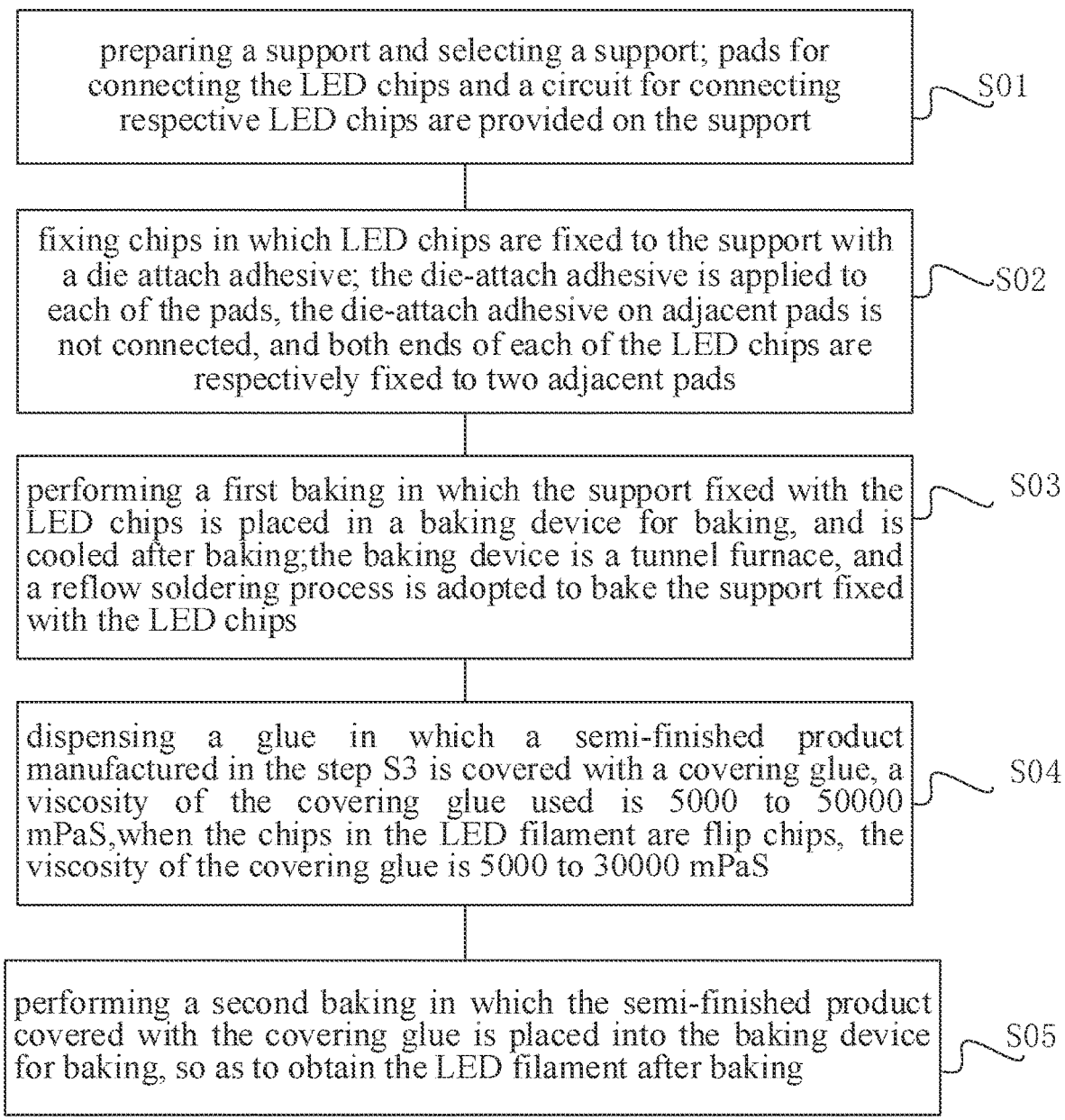
FIG. 13 is a flowchart of a manufacturing method of an LED filament.

As shown in FIG. 12, a multi-section LED filament support includes a plurality of board bodies 91, and two adjacent board bodies 91 are connected by a conductive connecting pin 92 and an outer end of each of the board bodies 91 at both ends is connected with a conductive pin 93.

A plurality of the board bodies 91 on the support are formed into a whole through the conductive connecting pin 92, and the support can be directly bent at the conductive connecting pin 92 when the bulb is manufactured, without need for welding to fix, and quality and manufacturing efficiency of the finished bulb can be improved.

Embodiment 4

An LED filament is provided, which is made by adopting the manufacturing method of the LED filament described above.

Embodiment 5

A multi-section LED filament includes the support. A plurality of LED chips are mounted on the support, and adjacent LED chips are electrically connected and the LED chips and the support are connected through a conductive connecting wire. A covering glue layer is provided outside the support, the LED chips and the conductive connecting wire.

The support can be directly bent at the conductive connecting pin 92 when the bulb is manufactured by using the support described in Embodiment 3, without need for welding to fix, and quality and manufacturing efficiency of the finished bulb can be improved.

Embodiment 6

A bulb includes a lamp cap 2, an shell 3, a stem 4 sealed with the shell, a conductive support 5 fixed to the stem 4 and a plurality of the LED filaments, the filaments are electrically and conductively connected to the conductive support 5.

When the flip-chip LED filament is used to make the bulb, the stem 4 is also provided with a molybdenum wire 6.

When the multi-section LED filament described in Embodiment 5 is adopted, each section of the filament can be with a same color temperature or a same color, or can be with different color temperatures or different colors, and multi-section filaments can be connected in series, in parallel or in series and parallel, which are multi-controlled by driving the power supply.

In the bulb composed of a plurality of ultra-thin ceramic LED filaments prepared by the manufacturing method described in Embodiment 1, each of the ultra-fine ceramic LED filaments can be chosen with different color temperatures or different colors, and the multi-section filaments can be connected in series, in parallel or in series and parallel, which are multi-controlled by driving the power supply.

Because Vf of the LED chips in the filament are different, the multi-section filaments can be matched with different voltages.

FIGS. 1 to 5 are schematic diagrams of four kinds of bulbs made of flip-chip LED filaments illustrated in this embodiment.

FIGS. 6 to 11 are schematic diagrams of seven kinds of bulbs made of normal-chip LED filaments illustrated in this embodiment.

Figure 9:
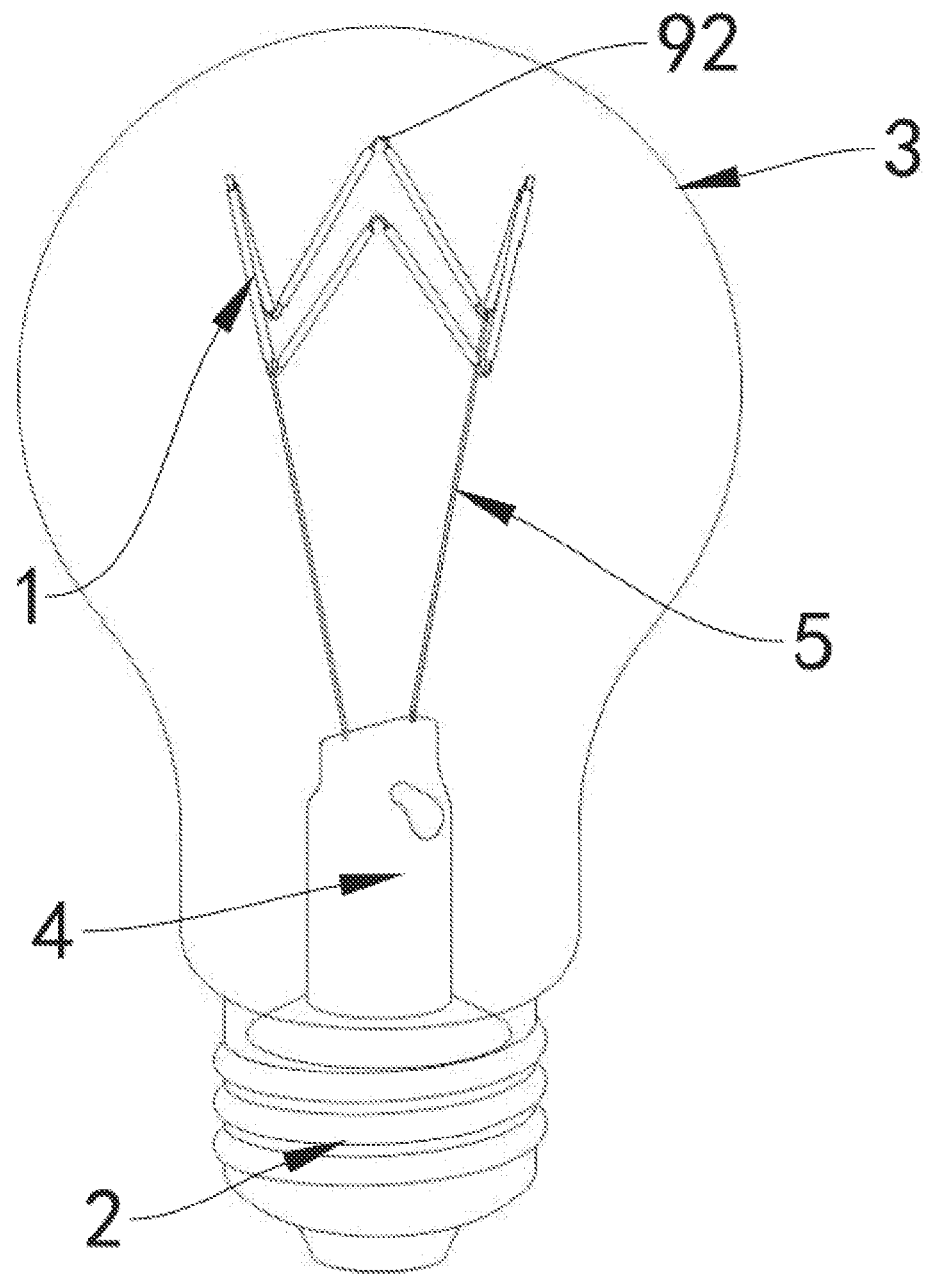
FIG. 9 is a schematic structural diagram of a bulb according to the present disclosure.
Figure 10:
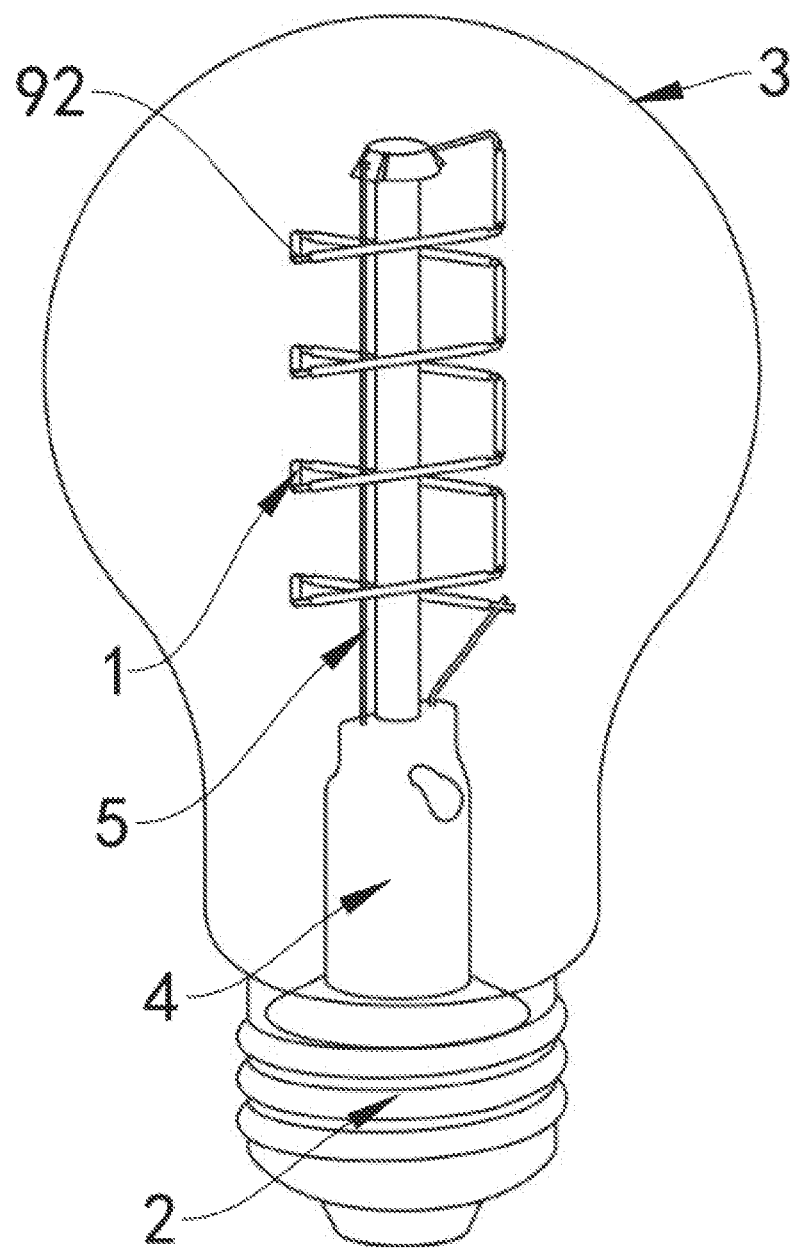
FIG. 10 is a schematic structural diagram of a bulb according to the present disclosure.
Figure 11:
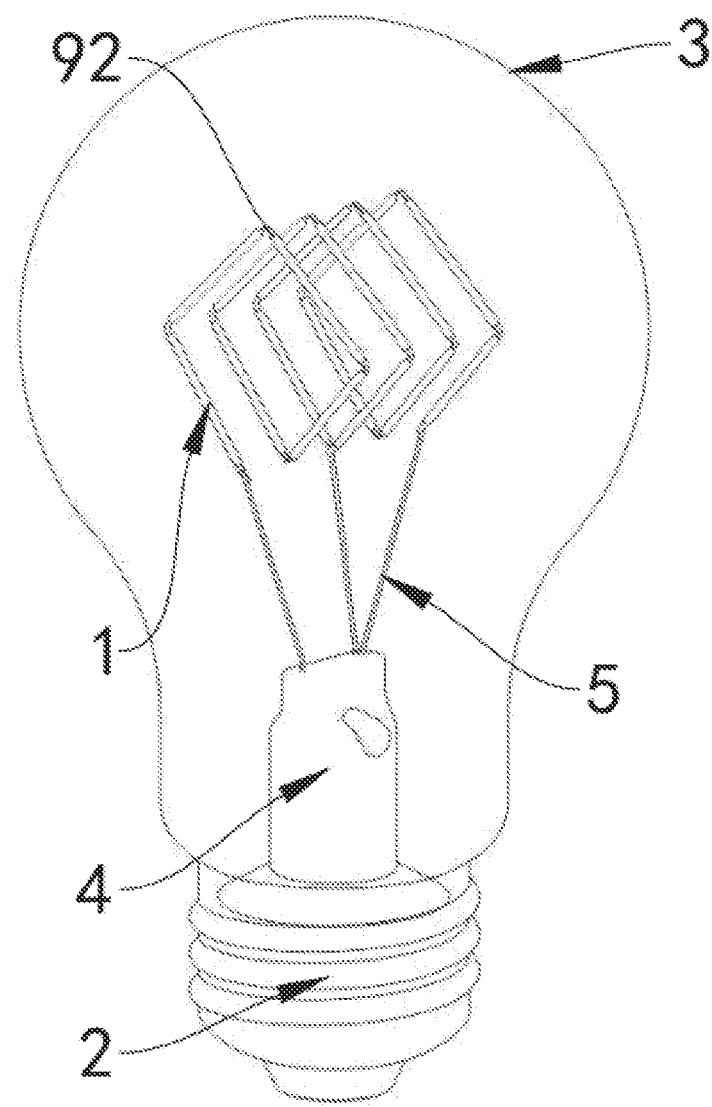
FIG. 11 is a schematic structural diagram of a bulb according to the present disclosure.

The support of the LED filaments in FIGS. 9 to 11 may be the support described in Embodiment 3.

Embodiment 7

A manufacturing method of a bulb made of LED filaments with flip chips includes following steps:

shaping the stem in which a molybdenum wire is shaped by a molybdenum wire machine;

spot welding the filaments in which the filaments are passed through molybdenum wire to be fixed to the stem, and conductively connected with the conductive support;

sealing a bulb in which the stem fixed with the filaments and the shell are vacuum sealed, and a sealed cavity is filled with gas of high thermal conductivity and low viscosity;

assembling the filaments in which a power supply is electrically connected with the filaments; and assembling with the lamp cap in which the power supply is assembled into and electrically and conductively connected with the lamp cap, and the lamp cap is fixed to the sealed shell.

Embodiment 8

A manufacturing method of a bulb made of LED filaments with normal chips includes following steps:

spot welding in which the multi-section filament is shaped, and fixed to and conductively connected with the stem;

sealing a bulb in which the stem fixed with the filaments and the shell are vacuum sealed, and a sealed cavity is filled with gas of high thermal conductivity and low viscosity;

assembling the filaments in which a power supply is electrically and conductively connected with the filaments; and assembling with the lamp cap in which the power supply is assembled into and electrically and conductively connected with the lamp cap, and the lamp cap is fixed to the sealed shell.

Embodiment 9

A manufacturing method of an LED filament includes following steps:

step S1, preparing a support in which a plurality of supports are selected;

step S2, fixing chips in which LED chips are fixed to the support with a die-attach adhesive;

step S3, performing a first baking in which the support fixed with the LED chips is placed in a baking device for baking, and is cooled after baking;

step S4, dispensing a glue in which a semi-finished product manufactured in S3 is covered with a covering glue with a viscosity of 5000 mPa·S; and step S5, performing a second baking in which the semi-finished product covered with the covering glue is placed into the baking device for baking, so as to obtain the LED filament after baking.

Embodiment 10

A manufacturing method of an LED filament includes following steps:

step S1, preparing a support in which a plurality of supports are selected;

step S2, fixing chips in which LED chips are fixed to the support with a die-attach adhesive;

step S3, performing a first baking in which the support fixed with the LED chips is placed in a baking device for baking, and is cooled after baking;

step S4, dispensing a glue in which a semi-finished product manufactured in S3 is covered with a covering glue with a viscosity of 50000 mPa·S; and step S5, performing a second baking in which the semi-finished product covered with the covering glue is placed into the baking device for baking, so as to obtain the LED filament after baking.

Embodiment 11

A manufacturing method of an LED filament includes following steps:

step S1, preparing a support in which a plurality of supports are selected;

step S2, fixing chips in which LED chips are fixed to the support with a die-attach adhesive;

step S3, performing a first baking in which the support fixed with the LED chips is placed in a baking device for baking, and is cooled after baking;

step S4, dispensing a glue in which a semi-finished product manufactured in S3 is covered with a covering glue with a viscosity of 15000 mPa·S; and step S5, performing a second baking in which the semi-finished product covered with the covering glue is placed into the baking device for baking, so as to obtain the LED filament after baking.

Embodiment 12

A manufacturing method of an LED filament includes following steps:

step S1, preparing a support in which a plurality of supports are selected;

step S2, fixing chips in which LED chips are fixed to the support with a die-attach adhesive;

step S3, performing a first baking in which the support fixed with the LED chips is placed in a baking device for baking, and is cooled after baking;

step S4, dispensing a glue in which a semi-finished product manufactured in S3 is covered with a covering glue with a viscosity of 60000 mPa·S; and step S5, performing a second baking in which the semi-finished product covered with the covering glue is placed into the baking device for baking, so as to obtain the LED filament after baking.

500 LED filaments each with a color temperature of 5000K and a length of 180 mm manufactured according to the manufacturing methods described in Embodiment 9, Embodiment 10, Embodiment 11 and Embodiment 12 are randomly selected. In a manufacturing process, only the viscosity of the covering glue is different in Embodiment 9, Embodiment 10, Embodiment 11 and Embodiment 12, and other conditions such as the proportion of fluorescent powders and a thickness of the covering glue are the same. The viscosity of the covering glue of Embodiment 9, Embodiment 10 and Embodiment 11 is within a range of the viscosity of the covering glue defined in the present disclosure. However, the viscosity of the covering glue in Embodiment 12 is outside a range of the viscosity of the covering glue defined in the present disclosure, which is a comparative example of this test.

2000 x and y values were obtained by a spectrum analyzer and recorded into a table. Then the measured data is calculated according to a color tolerance calculation formula, and finally calculation results are sorted out to get a following table.

| Color Tolerance/ SDCM | Embodiment 9 | | Embodiment 10 | | Embodiment 11 | | Embodiment 12 | |
|---|---|---|---|---|---|---|---|---|
| | Amount | Proportion | Amount | Proportion | Amount | Proportion | Amount | Proportion |
| 0 | 3 | 0.60% | 4 | 0.80% | 2 | 0.40% | 6 | 1.20% |
| 1 | 95 | 19.00% | 112 | 22.40% | 100 | 20.00% | 87 | 17.40% |
| 2 | 202 | 40.40% | 173 | 34.60% | 194 | 38.80% | 117 | 23.40% |
| 3 | 126 | 25.20% | 133 | 26.60% | 136 | 27.20% | 92 | 18.40% |
| 4 | 61 | 12.20% | 54 | 10.80% | 56 | 11.20% | 72 | 14.40% |

| Color Tolerance/ | Embodiment 9 | | Embodiment 10 | | Embodiment 11 | | Embodiment 12 | |
|---|---|---|---|---|---|---|---|---|
| SDCM | Amount | Proportion | Amount | Proportion | Amount | Proportion | Amount | Proportion |
| 5 | 11 | 2.20% | 19 | 3.80% | 10 | 2.00% | 55 | 11.00% |
| 6 | 2 | 0.40% | 5 | 1.00% | 2 | 0.40% | 31 | 6.20% |
| 7 | 0 | 0.00% | 0 | 0.00% | 0 | 0.00% | 22 | 4.40% |
| 8 | 0 | 0.00% | 0 | 0.00% | 0 | 0.00% | 11 | 2.20% |
| 9 | 0 | 0.00% | 0 | 0.00% | 0 | 0.00% | 5 | 1.00% |
| 10 | 0 | 0.00% | 0 | 0.00% | 0 | 0.00% | 2 | 0.40% |

When color tolerances of the LED filaments are 0 to 6 SDCM, all of the LED filaments are non-defective. The color tolerances of the LED filaments manufactured according to the manufacturing methods described in Embodiment 9, Embodiment 10 and Embodiment 11 are all within 0 to 6 SDCM, so a yield reaches 100%. However, 40 of the 500 LED filaments manufactured according to the manufacturing method described in Embodiment 12 have color tolerance greater than 6 SDCM, so the yield is only 92%. It can be concluded that the viscosity of the covering glue affects the light distribution of the LED filament. When the viscosity of the covering glue is between 5000 and 50000 mPa·S, distribution of fluorescent powders is relatively uniform, and the light distribution of the manufactured LED filament is relatively concentrated, with an extremely high yield, even reaching 100%.

According to the description and drawings of the present disclosure, those skilled in the art can easily manufacture or use the manufacturing method of the LED filament, the support, the LED filament, the bulb and the manufacturing method of the bulb, and positive effects described in the present disclosure can be achieved.

Unless otherwise specified, in the present disclosure, an orientation or positional relationship indicated by the terms "upper", "lower", "front", "rear", "left", "right", "vertical", "horizontal", "top", "bottom", "outer", "clockwise", "counterclockwise", "axial", "radial" "circumferential" and the like is based on an orientation or positional relationship shown in the drawings, which is only for the convenience of describing the disclosure and simplifying the description, but does not indicate or imply that the referred device or element must have a specific orientation, be constructed and operated in a specific orientation. Therefore, the terms describing the orientation or positional relationship in the present disclosure are only used for illustration and should not be understood as a limitation to the disclosure. For those of ordinary skill in the art, specific meanings of the above terms can be understood by referring to the drawings and according to specific situations.

Unless otherwise specified and limited, in this disclosure, the terms "providing", "coupling" and "connecting" should be understood in a broad sense, for example, it can be "fixedly connecting", or "detachably connecting" or "integrally connecting", or it can be "directly connecting" or "indirectly connecting through an intermediate medium", or it can be "communicating within two elements". For a person of ordinary skill in the art, specific meanings of the above terms in the present disclosure can be understood according to specific situations.

The above description is only preferred embodiments of the present disclosure and does not restrict the present disclosure in any form. Any simple modification and equivalent change made to the above embodiments according to technical essence of the present disclosure fall within protection scope of the present disclosure.

What is claimed is:

1. A manufacturing method of an LED filament, comprising following steps:
    step S1: preparing a support and selecting a support;
    step S2: fixing chips in which LED chips are fixed to the support with a die-attach adhesive;
    step S3: performing a first baking in which the support fixed with the LED chips is placed in a baking device for baking, and is cooled after baking;
    step S4: dispensing a glue in which a semi-finished product manufactured in the step S3 is covered with a covering glue, a viscosity of the covering glue used is 5000 to 50000 mPa·S; and
    step S5: performing a second baking in which the semi-finished product covered with the covering glue is placed into the baking device for baking, so as to obtain the LED filament after baking;
    wherein when the chips in the LED filament are flip chips,
    in the step S1, pads for connecting the LED chips and a circuit for connecting respective LED chips are provided on the support;
    in the step S2 the die-attach adhesive is applied to each of the pads, the die-attach adhesive on adjacent pads is not connected, and both ends of each of the LED chips are respectively fixed to two adjacent pads;
    in the step S3, the baking device is a tunnel furnace, and a reflow soldering process is adopted to bake the support fixed with the LED chips; and
    in the step S4, the viscosity of the covering glue is 5000 to 30000 mPa·S.

2. The manufacturing method of the LED filament according to claim 1, wherein the step S2 further comprises:
    step S21, unfreezing the die-attach adhesive stored at a low-temperature before fixing the chips;
    step S22, performing die expanding of the LED chips, and adding the die-attach adhesive into a die-bonding device;
    step S23, setting operation parameters of the die-bonding device;
    step S24, performing a die-bonding operation with the adjusted die-bonding device in which the die-attach adhesive is firstly coated on the pads;
    step S25, fixing the LED chips to the support;
    step S26, inspecting and testing a first die-bonded semi-finished product; and
    step S27, performing a die-bonding operation in a batch if the semi-finished product is inspected and tested to be qualified; and repeating the steps S23 to S26 if the semi-finished product is inspected and tested to be unqualified, until the semi-finished product is inspected and tested to be qualified.

3. The manufacturing method of the LED filament according to claim 1, wherein the reflow soldering process adopted in the step S3 specifically comprises following steps:
   step S31, setting a temperature of the tunnel furnace;
   step S32, heating the tunnel furnace until the temperature reaches a set value;
   step S33, placing the die-bonded semi-finished product into the tunnel furnace and baking it with the reflow soldering process;
   step S34, inspecting and testing the semi-finished product after the semi-finished product is baked;
   step S35, baking the die-bonded semi-finished product in a batch if the semi-finished product is inspected and tested to be qualified; and repeating the steps S32 to S34 if the semi-finished product is inspected and tested to be unqualified, until the semi-finished product is inspected and tested to be qualified; and
   step 36: performing a lighting test on the baked semi-finished products.

4. A manufacturing method of a bulb comprising the LED filament with flip chips according to claim 1, comprising:
   shaping a stem in which a molybdenum wire is shaped by a molybdenum wire machine;
   spot welding the filament in which the filament is passed through molybdenum wire to be fixed to the stem, and conductively connected with the conductive support;
   sealing a bulb in which the stem fixed with the filament and the shell are vacuum sealed, and a sealed cavity is filled with gas of high thermal conductivity and low viscosity;
   assembling the filament in which a power supply is electrically connected with the filament; and
   assembling with the lamp cap in which the power supply is assembled into and electrically and conductively connected with the lamp cap, and the lamp cap is fixed to the sealed shell.

5. The manufacturing method of the LED filament according to claim 1, wherein preparing the support in the step S1 comprises:
   preparing a plurality of board bodies;
   connecting two adjacent board bodies by a conductive connecting pin;
   connecting an outer end of each of the board bodies at both ends, with a conductive pin.

6. A manufacturing method of a bulb comprising the filament according to claim 5, comprising following steps:
   spot welding in which multiple sections of the filament are shaped, and fixed to and conductively connected with a stem;
   sealing a bulb in which the stem fixed with the filaments and the shell are vacuum sealed, and a sealed cavity is filled with gas of high thermal conductivity and low viscosity;
   assembling in which a power supply is electrically and conductively connected with the filaments; and
   assembling with the lamp cap in which the power supply is assembled into and electrically and conductively connected with the lamp cap, and the lamp cap is fixed to the sealed shell.

7. The manufacturing method of the LED filament according to claim 1, wherein the step S4 further comprises:
   step S41, preparing the covering glue;
   step S42, dispensing the glue on the semi-finished product prepared in the step S3 in a batch through a needle with an inner aperture of 0.45 mm~0.75 mm; and
   step S43: delivering the dispensed semi-finished product into the baking device for baking.

8. The manufacturing method of the LED filament according to claim 7, wherein the step S43 is executed within 30 min minutes after completion of the step S42.

9. The manufacturing method of the LED filament according to claim 7, wherein the covering glue in the step S41 mix with fluorescent powders, and the covering glue is proofed before use, the proofed comprises following steps:
   step S412: formulating the covering glue used for proofing according to a ratio of the glue and the fluorescent powders;
   step S413: covering the covering glue used for proofing on individual baked semi-finished products;
   step S414: proofing and short baking the dispensed semi-finished product prepared in step S413;
   step S415: inspecting and testing the proofed and short baked semi-finished product in step S414;
   step S416: producing the covering glue in a batch if the proofed and short baked semi-finished product is inspected and tested to be qualified; and repeating the steps S412 to S415 if the proofed and short baked semi-finished product is inspected and tested to be unqualified, until the proofed and short baked semi-finished product is inspected and tested to be qualified.

10. The manufacturing method of the LED filament according to claim 7, wherein the step S5 further comprises:
    step S51: long baking the baked semi-finished product after baking in step S43; and
    step S52: turning on the baking device to naturally cool the filament for 30 min after the long baking, and then taking out the finished LED filament.

11. A manufacturing method of an LED filament, comprising following steps:
    step S1: preparing a support and selecting a support;
    step S2: fixing chips in which LED chips are fixed to the support with a die-attach adhesive;
    step S3: performing a first baking in which the support fixed with the LED chips is placed in a baking device for baking, and is cooled after baking;
    step S4: dispensing a glue in which a semi-finished product manufactured in the step S3 is covered with a covering glue, a viscosity of the covering glue used is 5000 to 50000 mPa·S; and
    step S5: performing a second baking in which the semi-finished product covered with the covering glue is placed into the baking device for baking, so as to obtain the LED filament after baking;
    wherein the step S4 further comprises:
    step S41, preparing the covering glue;
    step S42, dispensing the glue on the semi-finished product prepared in the step S3 in a batch through a needle with an inner aperture of 0.45 mm~0.75 mm; and
    step S43: delivering the dispensed semi-finished product into the baking device for baking.

12. The manufacturing method of the LED filament according to claim 11, wherein the chips in the LED filament are normal chips,
    in the step S3, it is ensured that a temperature in the baking device reach a set temperature before the support fixed with the LEI) chips is placed into the baking device; and after the baking is finished, all of the LED chips are conductively connected through wires.

13. The manufacturing method of the LED filament according to claim 11, wherein the step S43 is executed within 30 min minutes after completion of the step S42.

14. The manufacturing method of the LED filament according to claim 11, wherein the covering glue in the step S41 mix with fluorescent powders, and the covering glue is proofed before use, the proofed comprises following steps:
- step S412: formulating the covering glue used for proofing according to a ratio of the glue and the fluorescent powders;
- step S413: covering the covering glue used for proofing on individual baked semi-finished products;
- step S414: proofing and short baking the dispensed semi-finished product prepared in step S413;
- step S415: inspecting and testing the proofed and short baked semi-finished product in step S414;
- step S416: producing the covering glue in a batch if the proofed and short baked semi-finished product is inspected and tested to be qualified; and repeating the steps S412 to S415 if the proofed and short baked semi-finished product is inspected and tested to be unqualified, until the proofed and short baked semi-finished product is inspected and tested to be qualified.

15. The manufacturing method of the LED filament according to claim 11, wherein the step S5 further comprises:
- step S51: long baking the baked semi-finished product after baking in step S43; and
- step S52: turning on the baking device to naturally cool the filament for 30 min after the long baking, and then taking out the finished LED filament.

16. The manufacturing method of the LED filament according to claim 11, wherein the step S2 further comprises:
- step S21, unfreezing the die-attach adhesive stored at a low-temperature before fixing the chips;
- step S22, performing die expanding of the LED chips, and adding the die-attach adhesive into a die-bonding device;
- step S23, setting operation parameters of the die-bonding device;
- step S24, performing a die-bonding operation with the adjusted die-bonding device in which the die-attach adhesive is firstly coated on the pads;
- step S25, fixing the LED chips to the support;
- step S26, inspecting and testing a first die-bonded semi-finished product; and
- step S27, performing a die-bonding operation in a batch if the semi-finished product is inspected and tested to be qualified; and repeating the steps S23 to S26 if the semi-finished product is inspected and tested to be unqualified, until the semi-finished product is inspected and tested to be qualified.

17. The manufacturing method of the LED filament according to claim 11, wherein the reflow soldering process adopted in the step S3 specifically comprises following steps:
- step S31, setting a temperature of the tunnel furnace;
- step S32, heating the tunnel furnace until the temperature reaches a set value;
- step S33, placing the die-bonded semi-finished product into the tunnel furnace and baking it with the reflow soldering process;
- step S34, inspecting and testing the semi-finished product after the semi-finished product is baked;
- step S35, baking the die-bonded semi-finished product in a batch if the semi-finished product is inspected and tested to be qualified; and repeating the steps S32 to S34 if the semi-finished product is inspected and tested to be unqualified, until the semi-finished product is inspected and tested to be qualified; and
- step 36: performing a lighting test on the baked semi-finished products.

18. A manufacturing method of a bulb comprising the LED filament with flip chips according to claim 11, comprising:
- shaping a stem in which a molybdenum wire is shaped by a molybdenum wire machine;
- spot welding the filament in which the filament is passed through molybdenum wire to be fixed to the stem, and conductively connected with the conductive support;
- sealing a bulb in which the stem fixed with the filament and the shell are vacuum sealed, and a sealed cavity is filled with gas of high thermal conductivity and low viscosity;
- assembling the filament in which a power supply is electrically connected with the filament; and
- assembling with the lamp cap in which the power supply is assembled into and electrically and conductively connected with the lamp cap, and the lamp cap is fixed to the sealed shell.

19. The manufacturing method of the LED filament according to claim 11, wherein preparing the support in the step S1 comprises:
- preparing a plurality of board bodies;
- connecting two adjacent board bodies by a conductive connecting pin;
- connecting an outer end of each of the board bodies at both ends, with a conductive pin.

20. A manufacturing method of a bulb comprising the filament according to claim 19, comprising following steps:
- spot welding in which multiple sections of the filament are shaped, and fixed to and conductively connected with a stem;
- sealing a bulb in which the stem fixed with the filaments and the shell are vacuum sealed, and a sealed cavity is filled with gas of high thermal conductivity and low viscosity;
- assembling in which a power supply is electrically and conductively connected with the filaments; and
- assembling with the lamp cap in which the power supply is assembled into and electrically and conductively connected with the lamp cap, and the lamp cap is fixed to the sealed shell.

* * * * *